United States Patent
Finarov

(10) Patent No.: US 9,960,286 B2
(45) Date of Patent: May 1, 2018

(54) SOLAR CELL BUS BARS

(71) Applicant: UTILIGHT LTD., Yavne (IL)

(72) Inventor: Moshe Finarov, Rehovot (IL)

(73) Assignee: UTILIGHT LTD., Yavne (IL)

( * ) Notice: Subject to any disclaimer, the term of this patent is extended or adjusted under 35 U.S.C. 154(b) by 131 days.

(21) Appl. No.: 15/030,073

(22) PCT Filed: Nov. 24, 2014

(86) PCT No.: PCT/IL2014/000060
§ 371 (c)(1),
(2) Date: Apr. 18, 2016

(87) PCT Pub. No.: WO2015/083148
PCT Pub. Date: Jun. 11, 2015

(65) Prior Publication Data
US 2016/0254394 A1    Sep. 1, 2016

Related U.S. Application Data

(60) Provisional application No. 61/911,510, filed on Dec. 4, 2013.

(51) Int. Cl.
| | |
|---|---|
| *H01L 31/0224* | (2006.01) |
| *H01L 31/02* | (2006.01) |
| *H01L 31/028* | (2006.01) |
| *H01L 31/068* | (2012.01) |
| *H01L 31/18* | (2006.01) |

(52) U.S. Cl.
CPC ........ *H01L 31/0201* (2013.01); *H01L 31/028* (2013.01); *H01L 31/022433* (2013.01); *H01L 31/068* (2013.01); *H01L 31/1876* (2013.01); *Y02E 10/50* (2013.01)

(58) Field of Classification Search
CPC ......... H01L 31/0201; H01L 31/022433; H01L 31/028; H01L 31/068; H01L 31/1876
USPC ........................................... 136/256
See application file for complete search history.

(56) References Cited

U.S. PATENT DOCUMENTS

| | | | |
|---|---|---|---|
| 2012/0305047 A1 | 12/2012 | Taira et al. | |
| 2013/0305528 A1 | 11/2013 | Anderson | |
| 2014/0202516 A1* | 7/2014 | Tohoda | H01L 31/02243 136/244 |

FOREIGN PATENT DOCUMENTS

| | | | |
|---|---|---|---|
| WO | WO 2013/046384 | * | 4/2013 |
| WO | 2013179282 A1 | | 12/2013 |

OTHER PUBLICATIONS

International Search Report & Written Opinion in PCT/IL2014/000060 dated Mar. 24, 2015.

\* cited by examiner

*Primary Examiner* — Jayne Mershon
(74) *Attorney, Agent, or Firm* — Manelli Selter PLLC; Edward J. Stemberger

(57) ABSTRACT

A bus bar for a silicon solar cell. The bus bar is a strip of electrically conductive material with a plurality of protrusions extending from at least one side of the bus bar.

14 Claims, 7 Drawing Sheets

DETAIL - D

DETAIL F

SOLAR CELL BUS BARS

TECHNOLOGY FIELD

The present bus bars design relates to crystalline silicon solar cells and in particular to crystalline silicon solar cells with front or back side grid containing bus bars and finger lines, which are being deposited in two separate stages.

BACKGROUND

Solar panels represent an array of crystalline silicon solar cells. The silicon solar cells are electrically connected in series and convert the incident solar energy into electrical current. Thin strips of tin-lead or tin-silver coated copper that conduct electricity connects between the crystalline silicon solar cells of the array. The strips, usually one to three millimeters wide, are called tabbing ribbons. The tabbing ribbons collect the current from separate crystalline silicon solar cells and conducts the direct current to a solar inverter. The inverter converts the direct current into useable alternating current.

An array of straight, parallel and equally spaced thin, about 30-120 micron wide, current conductors, termed finger lines, usually covers a small portion of the light receiving surface of each individual silicon solar cell. Finger lines reduce the resistance to the photoelectric current and provide lower current losses. Finger lines collect the current from the silicon solar cell surface and transfer it to the tabbing ribbons, through so called bus bars. Each silicon solar cell contains two or three bus bars. which are one to three millimeters wide electric current conducting lines. Typically, the bus bars are parallel to each other and equally spaced. The bus bars are orthogonal to the finger lines array. The tabbing ribbon is soldered to the surface of the bus bars and facilitates transfer of the electric current from the connected silicon solar cells onwards to another silicon solar cell or an accumulator or solar inverter.

Both bus bars and finger lines are usually realized by a single stage of screen printing, which lays down the bus bars and the finger lines across and along the solar cell. More recent methods, deposit the bus bars and finger lines in two successive printing stages. One possible reason for the two stage deposition process is the use of two different materials for the bus bars and the finger lines. Another possible reason is the desire to print bus bars thinner than finger lines, and another possible reason is the use of screen print for bus bars and another printing method (for example, the PTP process by Utilight or stencil print) for deposition of the finger lines. When printing the front side grid in two successive stages, typically, the finger lines are printed and dried first and the bus bars are printed over the finger lines. While a single print step will result in similar heights of the bus bar and the finger lines, in two stage printing, in order to have secured contact between the finger lines and the bus bars, and due to possible miss-alignment between the two patterns, there is a need for an overlap between the two patterns. In the overlap areas of the finger lines and bus bars the height will be different than in the area where finger lines or bus bars only are printed.

The printed height of finger lines is 10 micron to 25 micron: The bus bar height of 5 micron to 25 micron and is sufficient for the subsequent tabbing ribbon soldering process. Common screen printing technology results in bus bars printed over the finger lines. The segments of the bus bars which are printed over the already printed and dried finger lines include bus bar segments with height greater than the rest of the surface of the bus bars. A similar problem could occur when finger lines are printed over previously printed bus bars.

When soldering the tabbing ribbons to the bus bars, such height difference or protrusions can interfere with the tin-lead or tin-silver contact to both surfaces and result in poor soldering and low peel strength.

SUMMARY

Disclosed is a silicon solar cell. The cell includes bus bars that are strips of electrically conductive material with a plurality of protrusions extending from at least one side of the bus bars. The bus bars have almost a flat surface configured to receive the tabbing ribbon. The silicon solar cell also includes a plurality of finger lines that are printed as separate segments with gaps between the segments. Both the bus bars and the finger lines are printed on the light receiving surface of the solar cell substrate. In one example, both the bus bars and the finger lines are deposited or printed using the same material. In another example, the bus bars are printed or deposited using a material different from the material the finger lines are made. In one example, the bus bars containing the protrusions are printed in the gaps between the segments of the finger lines, such that the protrusions are printed at least over the ends of finger lines segments. In another example, the bus bars are printed first and the finger lines segments overlap the protrusions.

In both cases, the printing results in overlapping areas on the protrusions being higher than the bus bars that maintain almost flat or substantially flat surface with width larger than the tabbing ribbon width plus its deposition tolerances, sufficient for the tabbing ribbons to be attached. The protrusions in the overlapping areas do not complicate the printing stages, cause a negligible increase in shading loses and reduce the risks of poor tabbing.

The bus bars are deposited or printed on the solar cell in one deposition stage and the finger lines are deposited on the solar cell in another deposition stage separate from the deposition stage at which the bus bars are deposited. The bus bars and finger lines could have different thickness.

LIST OF FIGURES

In order to understand the present printing method and to see how it may be carried out in practice, examples will now be described, by way of non-limiting example only, with reference to the accompanying drawings, in which.

DESCRIPTION

The two stage screen printing process of bus bars and finger lines results in non-uniform height of the bus bars segments printed over (or under) the finger lines. The non-uniform bus bar height, characterized by sharp height changes at the printed over the finger lines segments of the bus bar complicates the tabbing ribbon to the bus bars soldering. The present disclosure offers' a solution to this problem.

Figure 1:
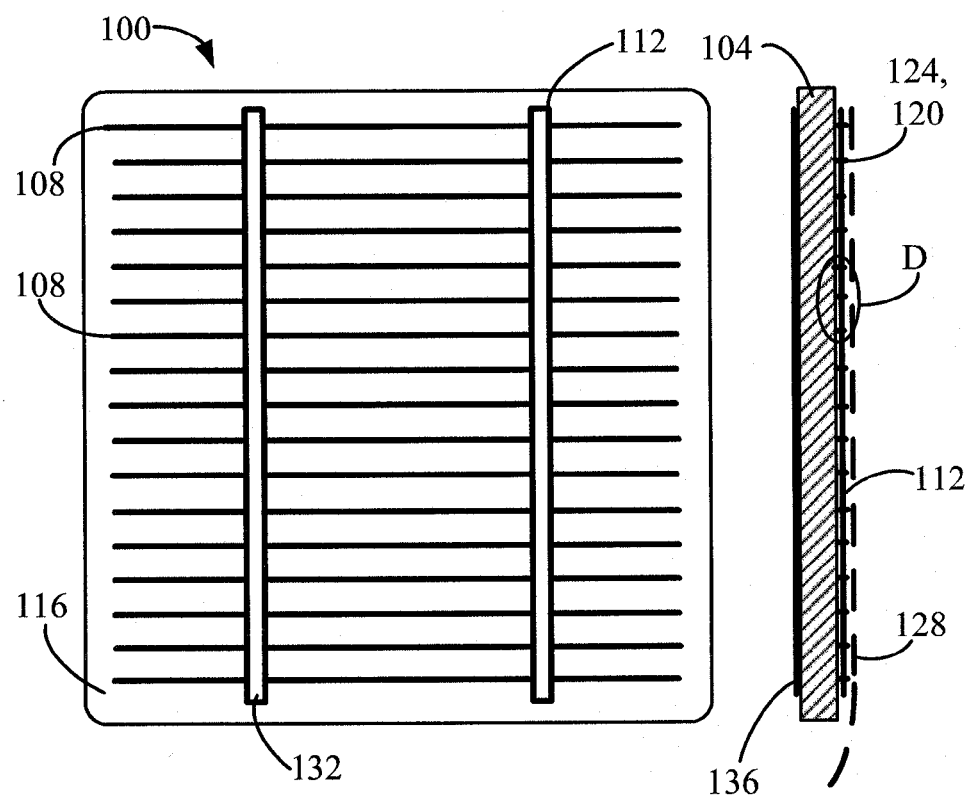
FIG. 1 is an example of prior art printed bus bar and finger lines.

FIG. 1 is an example of prior art printed bus bar and finger lines. Silicon solar cell 100 includes a silicon substrate 104, a plurality of finger lines 108 configured to collect electric current generated by silicon solar cell 100 upon interaction with incident solar light, and two or more bus bars 112 configured to be in electric connection with each of the finger lines 108 and to collect the electric current generated by silicon solar cell 100. Typically, finger lines 108 are printed first on the first or light receiving surface 116 of silicon solar cells 100. Silicon solar cells are used as an example only and other light responsive materials could be used. The printed finger lines are fired to provide good electric contact and adhesion with the silicon light receiving surface 116. Bus bars 112 are printed across and over the plurality of finger lines 108 of silicon solar cells 100. This type of printing ensures that the over printed segments of the bus bars and finger lines will have low electrical resistance and the photoelectric current losses will be low. However, segments 120 of bus bars 112 that are printed over finger lines 108 have a different thickness or height than other segment bus bar 112 have. Segments 120 form steps or bumps 124 (FIG. 2) on surface 132 of bus bar 112 that complicate later soldering to bus bars 112 of tabbing ribbons 128, schematically shown in broken lines. Also shown in FIG. 1 are backside contacts 136 printed or attached by other means to the back or second surface of silicon solar cell 100.

Figure 2:
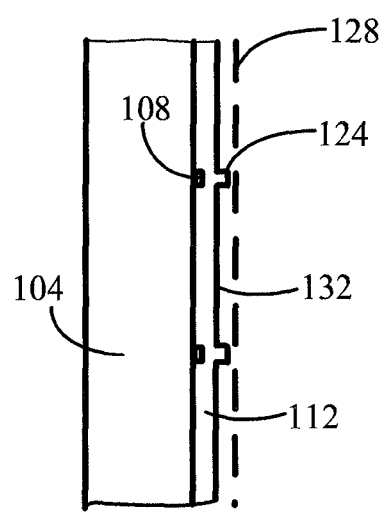
FIG. 2 is an illustration of a detail of a bus bar of FIG. 1.

FIG. 2 is an illustration of a detail of a silicon solar cell 100 of FIG. 1 including a screen printed bus bar 112. The detail has been magnified to illustrate the problem caused by the two stage printing of finger lines 108 and bus bars 112. The two stage printing results in bumps 124 formed at the intersection of finger lines 108 and bus bars 112. Bumps 124 complicate tabbing ribbon 128 to bus bar 112 surface 132 soldering.

Figure 3:
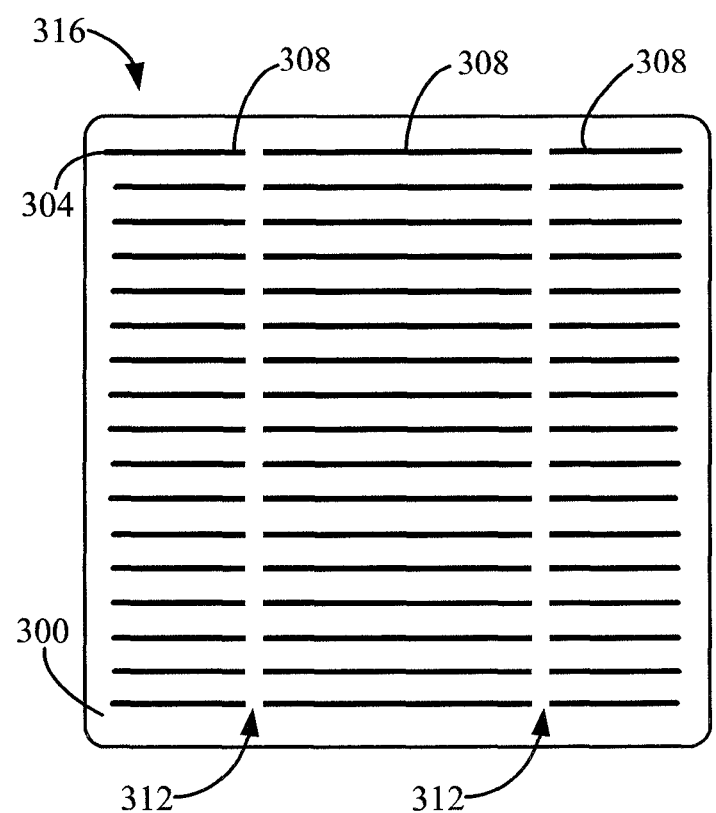
FIG. 3 is an illustration of finger lines printed according to an example.

FIG. 3 is an illustration of finger lines printed according to an example. Silicon solar cell 300 includes a plurality of finger lines 304 configured to collect electric current generated by silicon solar cell 300 upon interaction with incident solar light. Finger lines 304 could be printed or deposited on the light receiving surface of the solar cell surface 300 of silicon solar cell as segments 308 separated by gaps 312. The printed finger lines could be fired to provide good electric contact and adhesion with the silicon solar cell 316.

Figure 4:
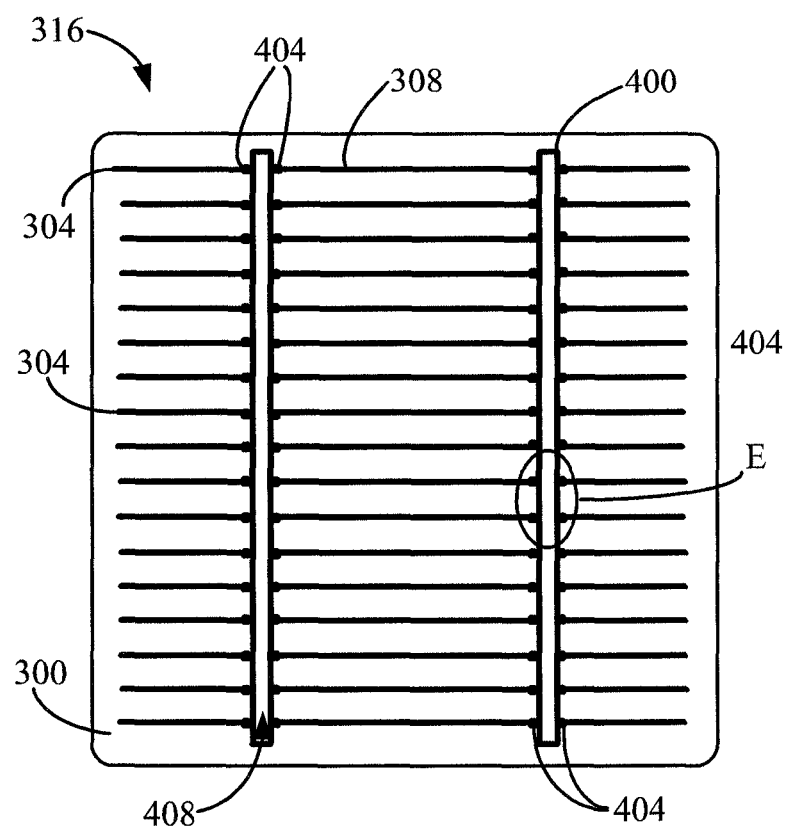
FIG. 4 is an illustration of a bus bar printed according to an example.
Figure 5A:
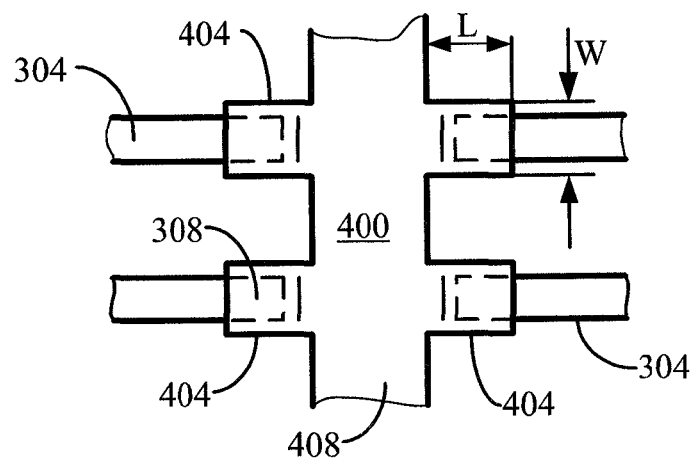
FIG. 5 is an illustration of a detail of the bus bar of FIG. 4.
Figure 5B:
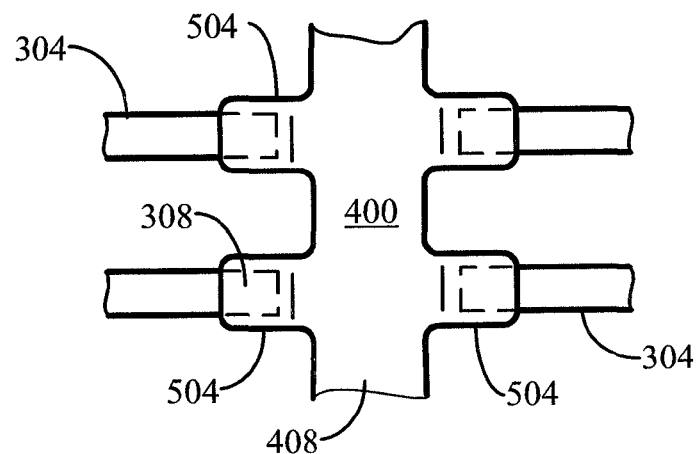

FIG. 4 is an illustration of an example of bus bars added by screen printing to silicon solar cell 316. Bus bars 400 are also printed on the light receiving surface of silicon solar cell 316 and are configured to be in electrical connection with each of the finger lines 304 segments 308 and to collect the electric current generated by the silicon solar cell 316. The bus bars are deposited or printed on the solar cell in one deposition stage and the finger lines are deposited on the solar cell in another deposition stage separate from the deposition stage at which the bus bars are deposited. The bus bars and finger lines could have different thickness. In one example, each of bus bars 400 is a strip of electrically conductive material with a plurality of protrusions 404 extending from at least one side of the strip or bus bar 400. Bus bars 400 including bus bar protrusions 404 are printed across the plurality of finger lines 304 in gaps 312 (FIG. 3) between the segments of finger lines 308. The cross section of the bus bars is usually selected to support a reliable conduction of the collected current and the height of the bus bars is usually selected to support reliable soldering of tabbing ribbons 128 (FIG. 1). The length L of protrusions 404, as shown in FIGS. 5A and 5B could vary from few hundreds of micron to few millimeters. The width W of protrusions 500 could be similar to the width of finger lines 304, although in some examples it could be wider than the width of finger lines 304 to compensate for misalignment tolerances.

Bus bars 400 and protrusions 404 are printed at the same printing stage and naturally could have the same height which could vary from 5 to 25 microns or any other desired height. Protrusions 404 are printed over the ends 308 of finger line segments forming finger lines 304 and could have a height different from the height surface 408 of bus bar 400 has. Surface 408 of bus bars 400 remains almost flat and it is proper configured to receive tabbing ribbons 128 (FIG. 1). In one example, both the bus bars and the finger lines are deposited or printed using the same material. In another example, the bus bars are printed or deposited using a material different from the material the finger lines are made. The printing sequence disclosed maintains surface 408 of bus bar 400 almost flat or substantially and supports easy soldering of the tabbing ribbons 128. Wider than finger lines extensions could reduce the accuracy required for printing the bus bars and bus bar protrusions over the earlier printed segments of the finger lines.

In FIG. 5A bus bar protrusions 404 are shown as terminated at sharp angles. In some examples (FIG. 5B) the bus bar protrusions 504 could be rounded to minimize electric charge/current loses.

Shading of the solar cells could be considered in deciding the proper width of the bas bar protrusions. However, unlike making the whole bus bars wider, only a small area of the protrusions could increase the shading. The protrusions area based on the protrusion sizes discussed above could increase the shading loses by less than 0.06% which is a negligible shading losses increase. An alternative solution, for example, increase of bus bars width to create a flat surface sufficient to receive a tabbing ribbon width plus its deposition misalignment tolerances would cause a significant increase in shading loss.

Figure 6:
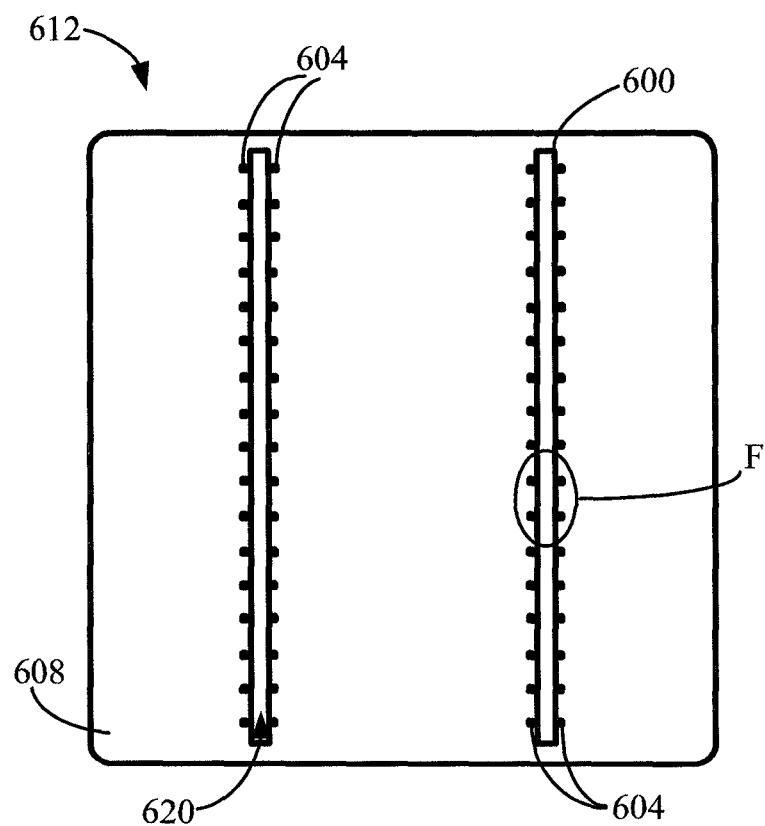
FIG. 6 is an illustration of a bus bar printed according to another example.
Figure 7:
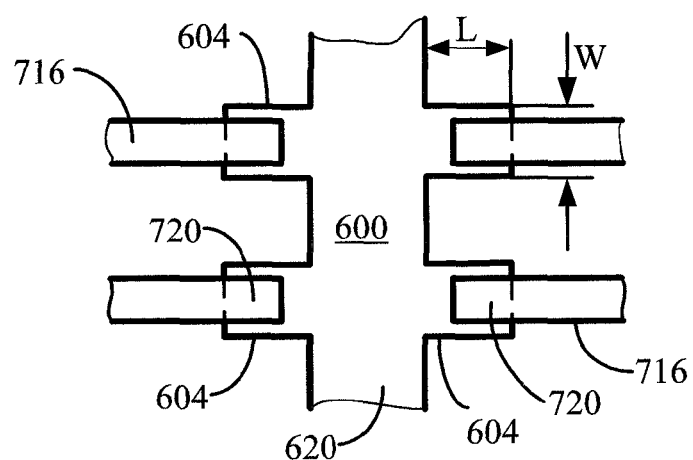
FIG. 7 is an illustration of a detail of finger lines printed according to the example of the bus bar of FIG. 6.

In another example, illustrated in FIG. 6, bus bars 600 containing protrusions 604 are printed first on light receiving surface 608 of silicon solar cell 612. Following at least drying of the bus bars, finger line segments 616 (FIG. 7) are printed next on the light receiving surface 608 of silicon solar cell 612. The finger lines are printed such that ends 720 of finger line segments 716 (FIG. 7) are printed over protrusions 604 of bus bars 600 and overlap the protrusions. Surface 620 of bus bars 600 remains flat and it is proper configured to receive tabbing ribbons 128 (FIG. 1) and supports easy soldering of tabbing ribbons 128.

Several silicon solar cells containing bus bars with a flat surface could now be easy connected together to form a solar cell array or panel. The tabbing ribbon that connects between one silicon solar cell and the next silicon solar cell can be easy soldered to flat surface of 408 or 608 of respective bus bars 400 (FIG. 4) or 600 and flat surface of backside contact 136 (FIG. 1) of the next adjacent silicon solar cell and so on. This chaining of silicon solar cells may be repeated to connect several solar cells in series to increase the output voltage of the solar cell array or panel.

It will be appreciated by persons skilled in the art that the present disclosure is not limited to what has been particularly shown and described hereinabove. Rather, the scope of the method and apparatus includes both combinations and sub-combinations of various features described hereinabove

What is claimed is:

1. A pattern of electrically conductive material printed on a silicon solar cell comprising:
   at least one bus bar and a plurality of finger lines the bus bar and the finger lines made of electrically conductive material and deposited in two deposition processes, wherein the bus bar is a strip of substantially flat surface made of electrically conductive material configured to receive a tabbing ribbon of about the same width than that of the strip with a plurality of protrusions extending from at least one side of the strip beyond the tabbing ribbon; and
   the finger lines are printed such that they overlap at least at one end of the protrusions but do not continue under the tabbing ribbon.

2. The pattern according to claim 1, wherein height of the strip of electrically conductive material is at least 5 micron and.

3. The pattern according to claim 1, wherein the protrusions extending from at least one side of the bus bar are printed over finger line segments ends.

4. The pattern according to claim 1, wherein segments ends of finger lines are printed over the protrusions extending from at least one side the bus bar.

5. The pattern according claim 2 wherein height of the bus bar is different from height of the finger lines.

6. A solar cell comprising a substrate with at least one bus bar including a plurality of protrusions extending from at least one side of the bus bar and at least one segmented finger line; and
   wherein the at least one segmented finger line is deposited on the substrate in a deposition stage separate from the deposition stage at which the bus bar is deposited.

7. The solar cell according to claim 6 further comprising:
   a plurality of finger line segments printed on light receiving surface of a silicon solar cell;
   at least one bus bar configured to receive a tabbing ribbon and wherein the bus bar includes a plurality of protrusions extending from at least one side of the bus bar printed on light receiving surface of the silicon solar cell; and
   wherein at least one of the plurality of protrusions extending from at least one side of the bus bar and at least one of the plurality of the finger line segments at least partially overlap each other.

8. The solar cell according to claim 6 wherein the bus bars and finger lines are made of different materials.

9. The solar cell according to claim 6 wherein the bus bars and the finger lines are made of different thickness.

10. The solar cell according to claim 6 wherein the finger lines segments are printed over bas bar protrusions.

11. The solar cell according to claim 6 wherein the bus bar protrusions are printed over the finger line segments.

12. The solar cell according to claim 6 wherein the bus bar with a plurality of protrusions extending from at least one side the bus bar is printed in gaps between the finger line segments.

13. The solar cell according to claim 6 wherein the bus bar includes at least one flat surface configured to receive a tabbing ribbon.

14. A solar panel comprising:
   at least two silicon solar cells according to claim 6, said cells configured to generate electric current upon interaction with incident solar light; and
   at least one tabbing ribbon connecting between the at least two silicon solar cells, the ribbon soldered to at least one substantially flat surface on at least one of the bus bars.

* * * * *